(12) United States Patent
Jang et al.

(10) Patent No.: US 6,248,632 B1
(45) Date of Patent: Jun. 19, 2001

(54) METHOD OF FORMING GATE ELECTRODE WITH POLYCIDE STRUCTURE IN SEMICONDUCTOR DEVICE

(75) Inventors: Se Aug Jang; Heung Jae Cho, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/459,510

(22) Filed: Dec. 13, 1999

(30) Foreign Application Priority Data

Dec. 24, 1998 (KR) ................................................ 98-58572

(51) Int. Cl.$^7$ ................................................ H01L 21/336
(52) U.S. Cl. ................ 438/261; 438/258; 438/528; 438/264; 438/585; 438/592; 438/683; 438/652
(58) Field of Search ........................ 438/261, 264, 438/528, 910, 585, 258, 655, 592, 683, 652

(56) References Cited

U.S. PATENT DOCUMENTS

| | | | |
|---|---|---|---|
| 4,470,189 | * 9/1984 | Roberts et al. | 29/571 |
| 4,833,099 | 5/1989 | Woo | 437/41 |
| 4,897,368 | 1/1990 | Kobushi et al. | 437/200 |
| 5,393,685 | 2/1995 | Yoo et al. | 437/44 |
| 5,429,974 | * 7/1995 | Hsue et al. | 437/52 |
| 5,508,212 | 4/1996 | Wang et al. | 437/24 |
| 5,648,287 | 7/1997 | Tsai et al. | 437/44 |
| 5,710,454 | * 1/1998 | Wu | 257/413 |
| 5,723,893 | * 3/1998 | Yu et al. | 257/413 |
| 6,069,041 | * 5/2000 | Tanigami et al. | 438/261 |
| 6,074,915 | * 6/2000 | Chen et al. | 438/258 |

FOREIGN PATENT DOCUMENTS

| | | | |
|---|---|---|---|
| 01245560 | 9/1989 | (JP) | H01L/29/78 |
| 02031427 | 2/1990 | (JP) | H01L/21/336 |
| 07202011 | 8/1995 | (JP) | H01L/21/8238 |
| 08195358 | 7/1996 | (JP) | H01L/21/28 |
| 08250451 | 9/1996 | (JP) | H01L/21/28 |
| 10303422 | 11/1998 | (JP) | H01L/29/78 |

* cited by examiner

Primary Examiner—Matthew S. Smith
Assistant Examiner—V. Yevsikov
(74) Attorney, Agent, or Firm—Ladas & Parry

(57) ABSTRACT

A method of forming a gate electrode with a polycide structure in a semiconductor device which can improve the interface roughness between a polysilicon layer and a silicon layer, is disclosed. According to the present invention, a gate insulating layer and a doped polysilicon layer on the gate insulating layer are formed on a semiconductor substrate. A nitrogenous polysilicon layer is then formed on the surface of the polysilicon layer by ion-implanting nitrogen ions ($N_2^+$) into the surface of the polysilicon layer or by thermal-treating the surface of the polysilicon under the atmosphere of gas containing nitrogen. Next, a metal silicide layer is formed on the nitrogenous polysilicon layer. Thereafter, the metal silicide layer, the nitrogenous polysilicon layer and the polysilicon layer are etched sequentially to form a gate electrode.

4 Claims, 4 Drawing Sheets

METHOD OF FORMING GATE ELECTRODE WITH POLYCIDE STRUCTURE IN SEMICONDUCTOR DEVICE

BACKGROUND OF THE INVENTION

1. Field of the Invention

The present invention relates to a method of manufacturing a semiconductor device, particularly to a method of forming a gate electrode of a MOSFET, and more particularly to a method of forming a gate electrode with a polycide structure in semiconductor device.

2. Description of the Related Art

In general, a gate electrode of a MOS transistor has been formed of a doped polysilicon layer. However, as high integration of semiconductor device, the line widths of a gate electrode and other patterns become fine. Recently, the line width is reduced below 0.15 $\mu$m. Therefore, there are problems that it is difficult to apply the doped polysilicon layer to a gate electrode material in a high speed device, since the doped polysiliocn layer has a high resistivity. These problems are also growing more and more serious as the high integration of the semiconductor. To overcome these problems, a gate electrode with a polycide structure in which a silicide layer using a refractory metal such as tungsten(W) and titanium(Ti) is formed on the polysilicon layer, has been researched.

FIG. 1A to FIG. 1C show a method of forming a gate electrode with a titanium polycide structure in accordance with a prior art.

As shown in FIG. 1A, a gate oxide layer 11 is grown on a semiconductor substrate 10 and a doped polysilicon layer 12 deposited thereon.

As shown in FIG. 1B, a titanium silicide(TiSi$_x$) layer of an amorphous phase is deposited on the polysilicon layer 12 by physical vapor deposition(PVD) using TiSix target. Next, the TiSi$_x$ layer of the amorphous phase is thermal-treated by rapid thermal processing(RTP) at a selected temperature for several seconds, to be transformed into a titanium silicide (TiSi$_2$) layer 13 of a crystalline phase.

As shown in FIG. 1C, an oxide(or nitride) layer 14 is formed on the TiSi$_2$ layer 13, for a self-aligned contact (SAC) process which will be performed after. The oxide layer 14, the TiSi$_2$ layer 13, the polysilicon layer 12 and the gate oxide layer 11 are patterned by photolithography and etching process to form a gate electrode.

Conventionally several thermal processes such as a first thermal process for gate re-oxidation, a second thermal process for forming source/drain, a third thermal process for planarizing a intermediate insulating layer and a fourth thermal process for forming a capacitor and the like, are performed subsequently, after forming the gate electrode as above described.

FIG. 2 shows a cross sectional view of a gate electrode with a titanium polycide structure in which a TiSi$_2$ layer 23 is formed on a polysilicon layer 22 according to the prior art. However, when performing above thermal processes respectively, the TiSi$_2$ layer 23 is agglomerated to generate stress, so that Ti of TiSi$_2$ layer 23 is diffused into the polysilicon layer 22 and reacted with Si of the polysilicon layer 22, thereby deteriorating the interface roughness between the polysilicon layer 22 and the TiSi$_2$ layer 23(TiSi$_2$ layer/polysilicon layer), as shown in FIG. 2, after performing above thermal processes.

Furthermore, in case the interface roughness is extremely deteriorated, the TiSi$_2$ layer 23 comes in contact with a gate oxide layer 21, thereby deteriorating the property of the gate oxide layer 21. As a result, the reliability of a device is deteriorated.

As not above described, in FIG. 2, reference numbers 20, 24, 25 and 26 indicate a silicon substrate, a mask oxide layer, a spacer oxide layer and source/drain regions, respectively.

Moreover, although described on the gate electrode with the titanium polycide structure, these problems mostly occur in gate electrode with a polycide structure.

SUMMARY OF THE INVENTION

It is therefore an object of the present invention to provide a method of forming a gate electrode with a polycide structure in a semiconductor device which can improve the interface roughness between a polysilicon layer and a silicon layer by preventing a refractory metal of a silicide layer from diffusing into a polysilicon layer when performing thermal processing subsequently, for solving the problems in the conventional art.

To accomplish this above object, in the present invention, a nitrogenous polysilicon layer is formed on the surface of the polysilicon layer, prior to forming the silicide layer, considering the refractory metal diffusing into the polysilicon layer because of the columnar structure of the polysilicon layer.

According to the present invention, a gate insulating layer and a doped polysilicon layer on the gate insulating layer are formed on a semiconductor substrate. A nitrogenous polysilicon layer is then formed on the surface of the polysilicon layer by ion-implanting nitrogen ions(N$_2^+$) into the surface of the polysilicon layer or by thermal-treating the surface of the polysilicon under the atmosphere of gas containing nitrogen. Next, a metal silicide layer is formed on the nitrogenous polysilicon layer. Thereafter, the metal silicide layer, the nitrogenous polysilicon layer and the polysilicon layer are etched sequentially to form a gate electrode.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, preferred embodiment of the present invention will be explained with reference to accompanying drawings.

FIG. 3A to FIG. 3E are cross sectional views showing a method of forming a gate electrode with a titanium polycide structure according to an embodiment of the present invention.

Figure 1A:
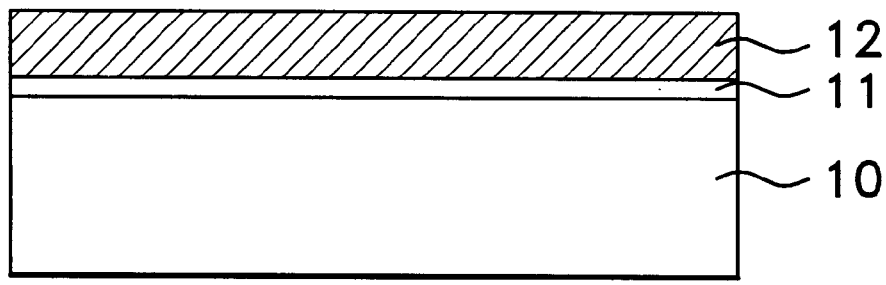
FIG. 1A to FIG. 1C are cross sectional views showing a method of forming a gate electrode with a titanium polycide structure in accordance with a prior art.
Figure 1B:
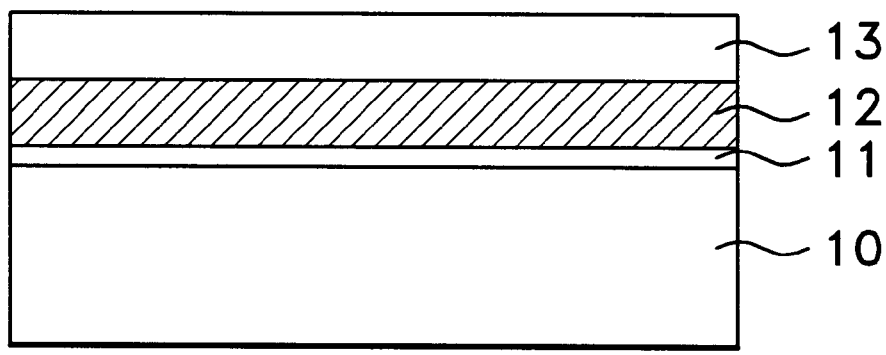
Figure 1C:
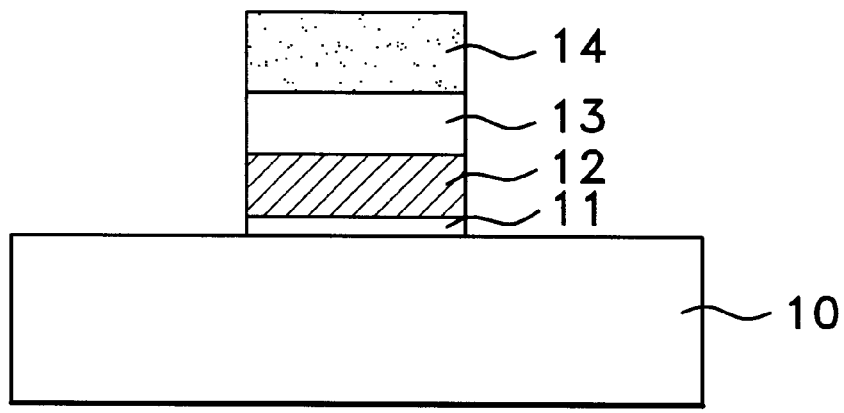
Figure 2:
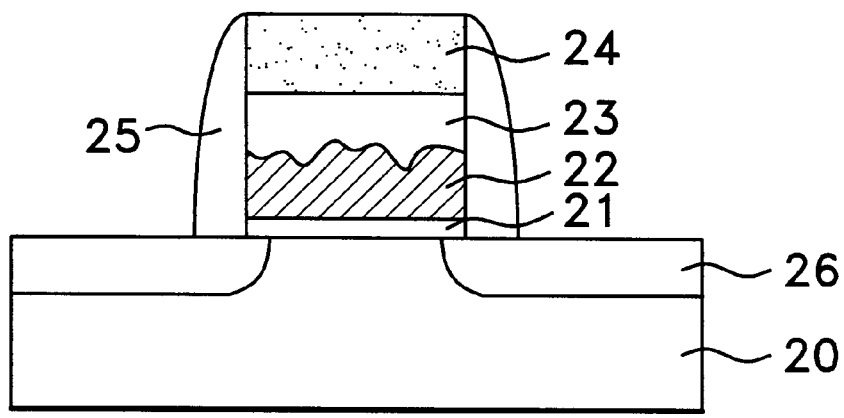
FIG. 2 is cross sectional view of a gate electrode with titanium polycide structure in accordance with a prior art.
Figure 3A:
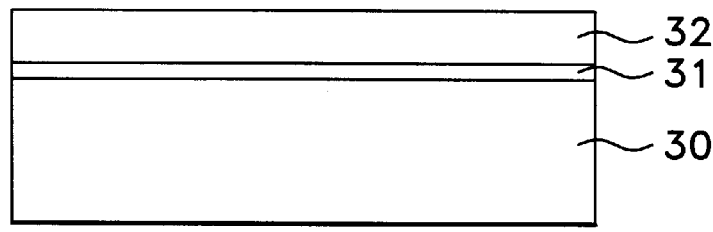
FIG. 3A to FIG. 3E are cross sectional views showing a method of forming a gate electrode with a polycide structure in accordance with an embodiment of the present invention.

Referring to FIG. 3A, a gate insulating layer 31 is grown on a silicon substrate 30 and a doped polysilicon layer 32 is deposited thereon.

Figure 3B:
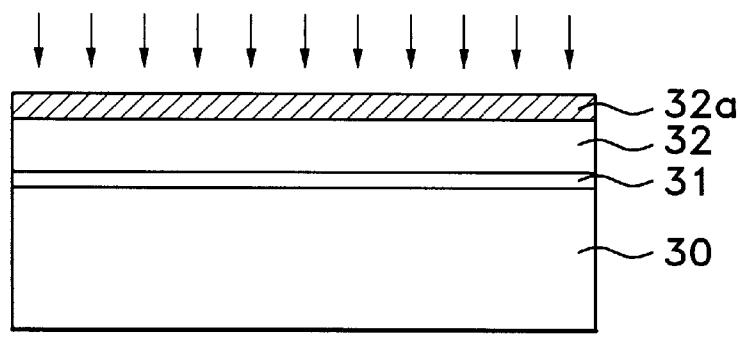

Referring to FIG. 3B, a nitrogenous polysilicon layer 32a is formed on the surface of the polysilicon layer 32 by ion-implanting nitrogen ions($N_2^+$) into the surface of the polysilicon layer 32 or by thermal-treating the surface of the polysilicon under the atmosphere of gas containing nitrogen such as $N_2$, $NH_3$ and $N_2O$. Preferably, the ion-implantation is performed to the energy of 10 to 30 keV and the dose of $1\times10^{14}$ to $1\times10^{16}$ ions/cm$^3$. Furthermore, the thermal-treating is performed at the temperature of 700 to 900° C. for 10 to 60 minutes.

Figure 3C:
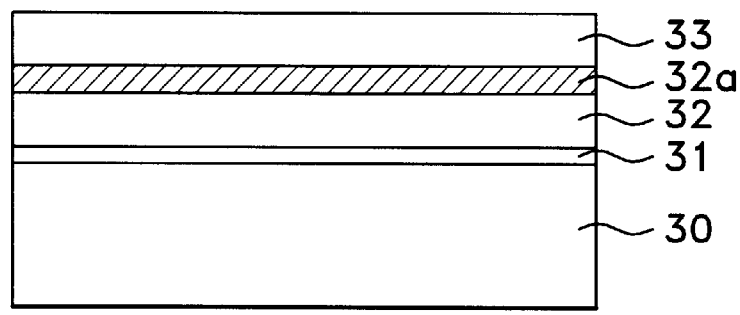

Referring to FIG. 3C, a titanium silicide($TiSi_x$) layer of an amorphous phase is deposited on the nitrogenous polysilicon layer 32a by PVD using $TiSi_x$ target. Next, the $TiSi_x$ layer of the amorphous phase is thermal-treated by RTP at a selected temperature for several seconds, to be transformed into a titanium silicide($TiSi_2$) layer 33 of a crystalline phase.

Figure 3D:
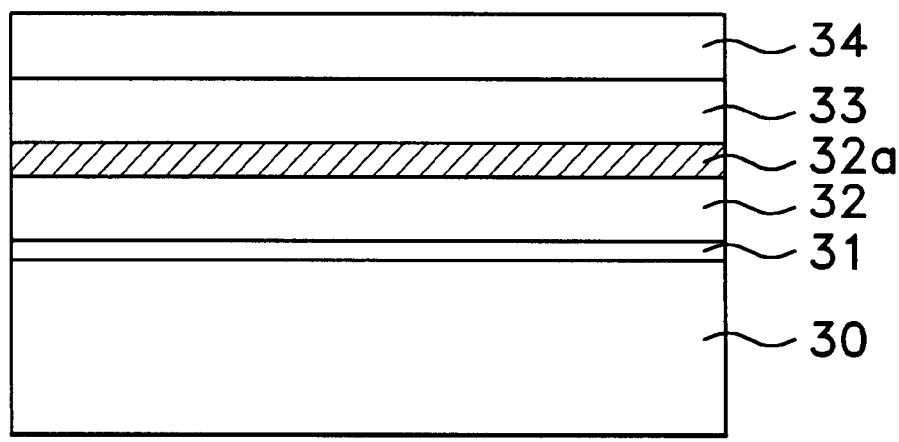
Figure 3E:
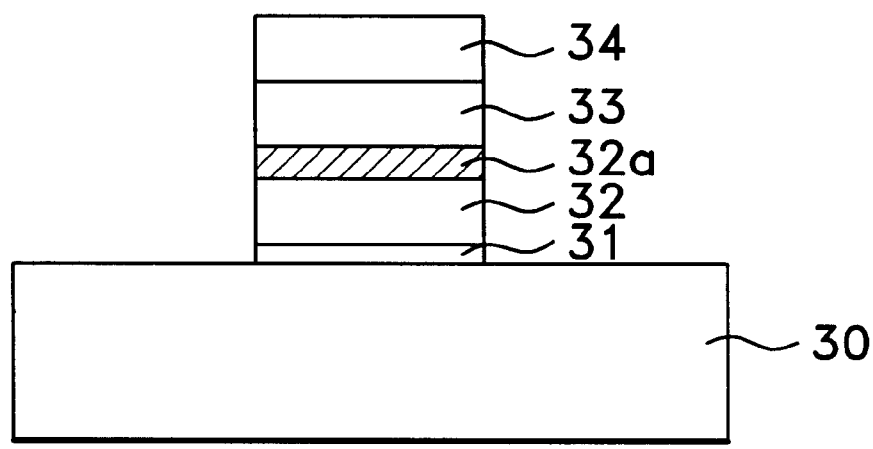

Referring to FIG. 3D, an oxide(or nitride) layer 34 is formed on the $TiSi_2$ layer 33, for a conventional self-aligned contact(SAC) process which will be performed after. Thereafter, the oxide layer 34, the $TiSi_2$ layer 33, the nitrogenous polysilicon layer 32a, the polysilicon layer 32 and the gate oxide layer 31 are etched sequentially to form a gate electrode, as shown in FIG. 3E.

According to this embodiment, the nitrogenous polysilicon layer is formed on the surface of the polysilicon layer using ion-implantation or thermal-treating prior to forming the $TiSi_2$ layer, so that $TiSi_2$ layer comes in contact with the nitrogenous polysilicon layer. Therefore, Ti of the $TiSi_2$ layer is prevented from diffusing into the polysilicon layer by the nitrogenous polysilicon layer, although stress is generated due to agglomeration of the $TiSi_2$ when performing thermal processing subsequently. As a result, the interface roughness between the polysilicon layer and the $TiSi_2$ layer, is improved, thereby improving the reliability of a device.

Furthermore, a method according to the present invention may be applied to a gate electrode with a polycide using a metal silicide such as a tungsten silicide($WSi_2$), a cobalt silicide($CoSi_2$), a vanadium silicide ($VSi_2$), a chromium silicide($CrSi_2$), a zirconium silicide($ZrSi_2$), a niobium silicide($NbSi_2$), a molybdenum silicide($MoSi_2$), a hafnium silicide($HfSi_2$) as well as the $TiSi_2$.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode with a polycide structure in a semiconductor device, comprising the steps of:

forming a gate insulating layer on a semiconductor substrate;

forming a doped polysilicon layer on the gate insulating layer;

forming a nitrogenous polysilicon layer on the surface of the polysilicon layer, wherein the nitrogenous polysilicon layer is formed by ion-implanting nitrogen ion (N2$^+$) into the surface of the polysilicon layer or by thermal-treating the surface of the polysilicon under the atmosphere of gas containing nitrogen;

forming a metal suicide layer on the nitrogenous polysilicon layer, wherein the metal silicide is formed of a compound selection from the group consisting of vanadium silicide ($VSi_2$), chromium silicide ($CrSi_2$) and zirconium silicide ($ZrSi_2$); and etching the metal silicide layer, the nitrogenous polysilicon layer and the polysilicon layer sequentially to form a gate electrode.

2. The method according to claim 1, the ion-implanting is performed to the energy of 10 to 30 keV and the dose of $1\times10^{14}$ to $1\times10^{16}$ ions/cm$^3$.

3. The method according to claim 1, wherein the thermal-treating is performed at the temperature of 700 to 900° C. for 10 to 60 minutes.

4. The method according to claim 1, wherein the gas containing nitrogen is one selected from a group consisting of $N_2$, $NH_3$ and $N_2O$.

* * * * *